(12) United States Patent
Yang et al.

(10) Patent No.: US 10,424,444 B2
(45) Date of Patent: Sep. 24, 2019

(54) SENSOR FOR CIRCUIT BREAKER OPEN AND CLOSE FAILURE PREDICTION

(71) Applicant: Eaton Corporation, Cleveland, OH (US)

(72) Inventors: He Yang, Shanghai (CN); Chao Xin, Shanghai (CN); Jiong Chen, Shanghai (CN); Mark Mao, Shanghai (CN); Li Yu, Pittsburgh, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 353 days.

(21) Appl. No.: 15/462,941

(22) Filed: Mar. 20, 2017

(65) Prior Publication Data

US 2017/0194113 A1 Jul. 6, 2017

Related U.S. Application Data

(63) Continuation-in-part of application No. 14/964,946, filed on Dec. 10, 2015, now Pat. No. 10,012,697.

(51) Int. Cl.
| | |
|---|---|
| *H01H 9/54* | (2006.01) |
| *G01R 31/327* | (2006.01) |
| *H01H 3/30* | (2006.01) |
| *H01H 33/666* | (2006.01) |
| *H01H 71/04* | (2006.01) |

(52) U.S. Cl.
CPC .......... *H01H 9/54* (2013.01); *G01R 31/3272* (2013.01); *G01R 31/3275* (2013.01); *G01R 31/3277* (2013.01); *H01H 3/3005* (2013.01); *H01H 33/666* (2013.01); *H01H 2033/6667* (2013.01);

(Continued)

(58) Field of Classification Search
None
See application file for complete search history.

(56) References Cited

U.S. PATENT DOCUMENTS

| 4,400,981 A | 8/1983 | Aoyagi et al. |
|---|---|---|
| 6,286,377 B1 | 9/2001 | Benke et al. |

(Continued)

FOREIGN PATENT DOCUMENTS

CN 103197235 A 7/2013

OTHER PUBLICATIONS

Chinese Patent Office, "First Office Action" (CN 201610663252.1, English Translation Summary attached), dated Mar. 26, 2019, 8 pp.

*Primary Examiner* — Clayton E. LaBalle
*Assistant Examiner* — Jas A Sanghera
(74) *Attorney, Agent, or Firm* — Eckert Seamans Cherin & Mellot, LLC

(57) ABSTRACT

A failure prediction assembly is structured to monitor circuit breaker assembly sub-assemblies and their component's characteristics. The failure prediction assembly includes a sensor supported D-shaft and a sensor assembly including a housing and a number of sensors. The sensor assembly housing defines a D-shaft passage. A control unit is in electronic communication with the sensor assembly. The sensor assembly housing is coupled to the circuit breaker sidewalls with the sensor assembly housing D-shaft passage aligned with the circuit breaker sidewall D-shaft passages. The sensor supported D-shaft is rotatably coupled to the sensor assembly with the sensor supported D-shaft disposed through said sensor assembly housing D-shaft passage.

20 Claims, 8 Drawing Sheets

(52) U.S. Cl.
CPC . *H01H 2071/044* (2013.01); *H01H 2300/052* (2013.01)

(56) References Cited

U.S. PATENT DOCUMENTS

2013/0134983 A1\* 5/2013 Cazals .................. H01H 71/04
　　　　　　　　　　　　　　　　　　　　　　324/415
2017/0045481 A1　2/2017　Benke et al.

\* cited by examiner

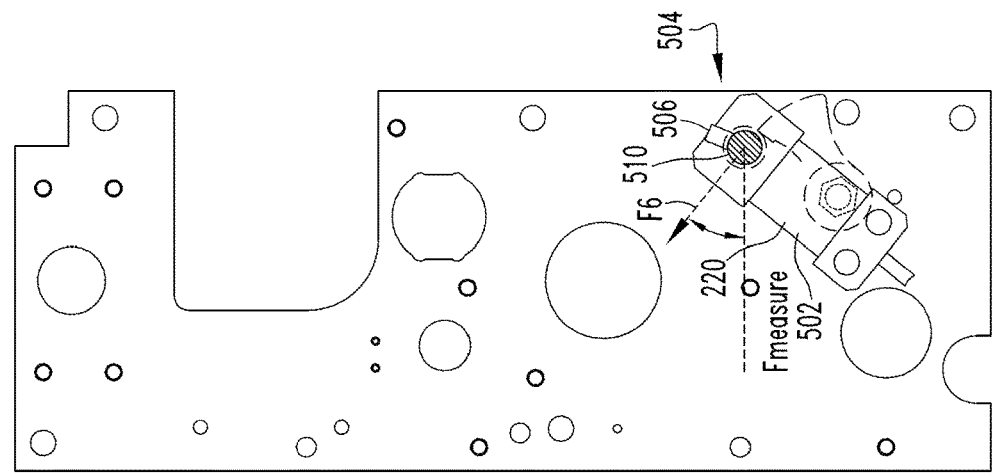
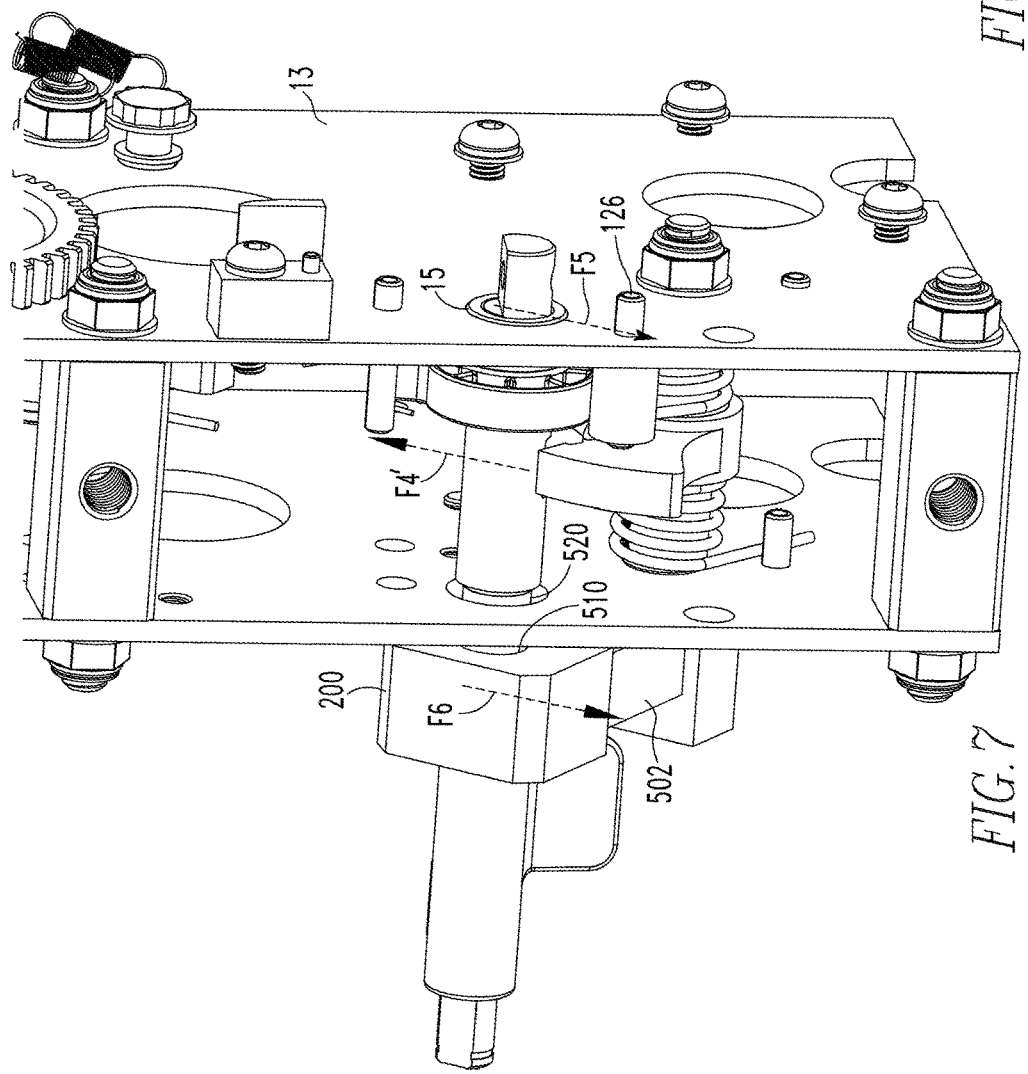
FIG. 8
FIG. 7

SENSOR FOR CIRCUIT BREAKER OPEN AND CLOSE FAILURE PREDICTION

CROSS REFERENCE TO RELATED APPLICATION

This application is a continuation-in-part application of and claims priority to U.S. patent application Ser. No. 14/964,946, filed Dec. 10, 2015 entitled, FAILURE PREDICTION DEVICE AND METHOD FOR VACUUM CIRCUIT BREAKERS.

BACKGROUND OF THE INVENTION

Field of the Invention

The disclosed and claimed concept relates to a circuit breaker and switchgear assembly with a failure prediction assembly and, more specifically, to a circuit breaker assembly with a failure prediction assembly with an FTB assembly.

Background Information

Circuit breaker assemblies provide protection for electrical systems from electrical fault conditions such as current overloads, short circuits, and low level voltage conditions. Typically, circuit breakers include a trip device and an operating mechanism. The trip device detects an over-current condition and actuates the operating mechanism. The operating mechanism opens and closes, either manually or in response to the trip device, a number of electrical contacts. These trip devices and protective relays are housed inside a switchgear cell along with the circuit breakers. In an exemplary embodiment, the operating mechanism utilizes a number of springs to generate force for the opening and closing operations. Further, the springs are maintained in a charged state so that, for example, following an over-current condition, the contacts may be closed without having to charge the springs.

The components of a circuit breaker assembly, such as, but not limited to, the operating mechanism components are subject to wear and tear over time. The signal output of other ancillary devices, such as, but not limited to, protective relays, trip units, etc., are also affected due to wear and tear of operating mechanisms and other subassemblies of the circuit breaker. When an operating mechanism component becomes worn, the operating mechanism component should be replaced before it fails during its service, which would cause power outage and increased unscheduled downtime. Rather than waiting for an operating mechanism component to become worn to the point of needing replacement, it is desirable to replace the operating mechanism component preemptively. The focus of the maintenance schedule has already been changed from planned to preventive maintenance; however, further advancement is needed to change it further to Reliability Centered Maintenance (RCM) where the component failure with its failure mode is predicted and maintenance is arranged at appropriate time in advance. That is, it is desirable to continuously monitor the "health" of the circuit breaker and switchgear subassemblies, operating mechanism components and predict when a component will fail.

There is, therefore, a need for a failure prediction assembly structured to monitor circuit breaker assembly operating mechanism component characteristics, as well as other components such as, but not limited to, switchgear, power distribution and transmission system components.

SUMMARY OF THE INVENTION

These needs, and others, are met by at least one embodiment of the disclosed and claimed embodiments which provides for a failure prediction assembly structured to monitor circuit breaker assembly sub-assemblies and their component's characteristics. Hereinafter, the specification will use operating mechanism components as an example. It is understood, however, that the component monitoring system is structured to monitor any circuit breaker assembly sub-assemblies and their component's characteristics and is not limited to monitoring operating mechanism components. The failure prediction assembly includes a sensor supported D-shaft and a sensor assembly including a housing and a number of sensors. The sensor assembly housing defines a D-shaft passage. A control unit is in electronic communication with the sensor assembly. The sensor assembly housing is coupled to the circuit breaker sidewalls with the sensor assembly housing D-shaft passage aligned with the circuit breaker sidewall D-shaft passages. The sensor supported D-shaft is rotatably coupled to the sensor assembly with the sensor supported D-shaft disposed through said sensor assembly housing D-shaft passage.

In this configuration, the sensor assembly is structured to determine forces acting on the sensor supported D-shaft. The control unit includes a Force/Torque Balance (FTB) assembly. The FTB assembly includes an FTB module that is structured to convert force measurement data from the sensor supported D-shaft to calculated component characteristics for other elements of the operating mechanism and the circuit breaker. Thus, the failure prediction assembly including the sensor supported D-shaft, the control unit, the FTB assembly and the FTB module solve the problems stated above.

BRIEF DESCRIPTION OF THE DRAWINGS

A full understanding of the invention can be gained from the following description of the preferred embodiments when read in conjunction with the accompanying drawings in which:

FIG. 7 is an isometric view of another embodiment of a trip latch member showing the forces acting thereon.

FIG. 8 is a side view of another embodiment of a sensor assembly coupled to the trip latch D-shaft.

DESCRIPTION OF THE PREFERRED EMBODIMENTS

Figure 1:
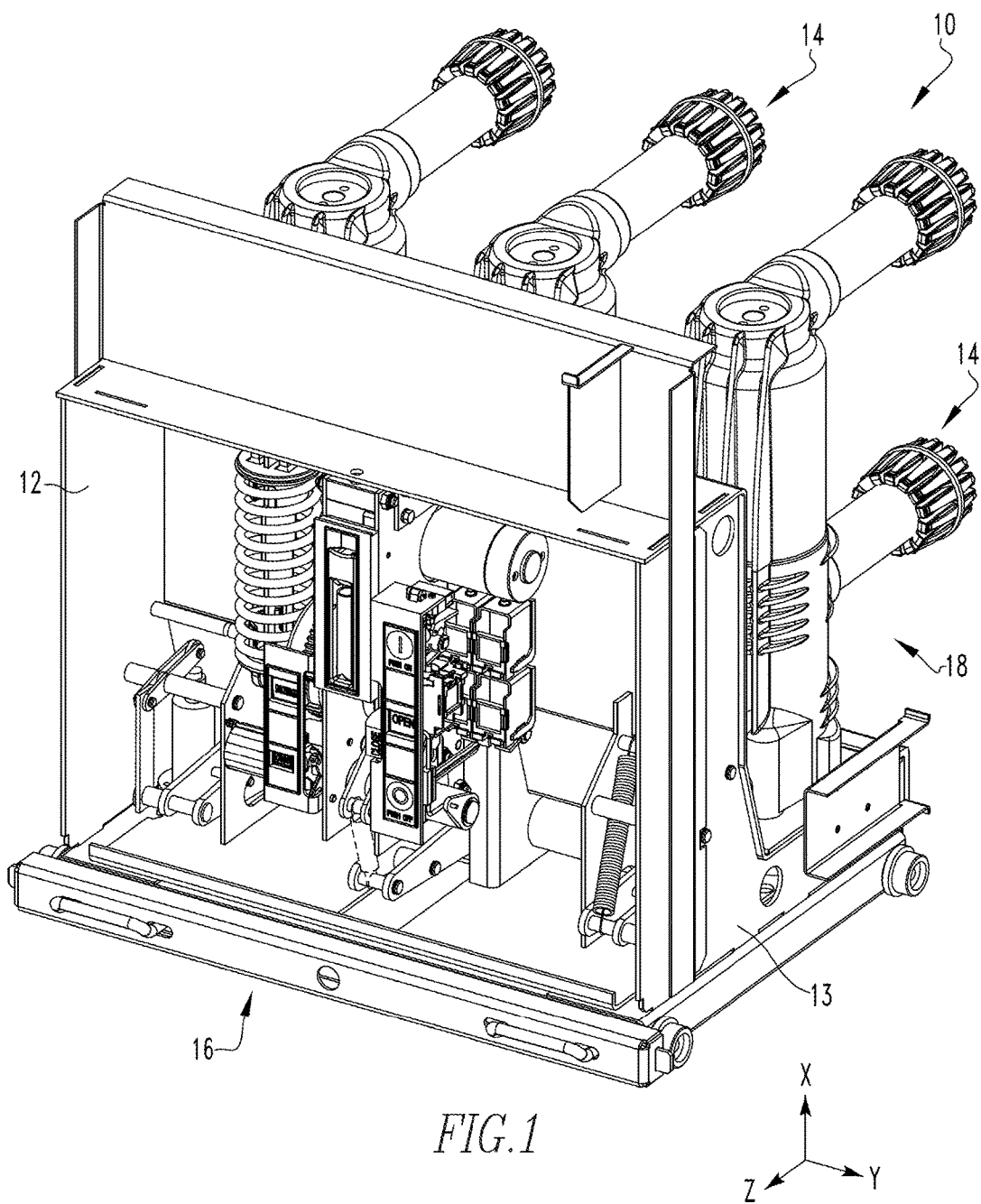
FIG. 1 is an isometric view of a circuit breaker assembly.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. It is noted that moving parts, such as but not limited to circuit breaker contacts, are "directly coupled" when in one position, e.g., the closed, second position, but are not "directly coupled" when in the open, first position. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof.

As used herein, the phrase "removably coupled" means that one component is coupled with another component in an essentially temporary manner. That is, the two components are coupled in such a way that the joining or separation of the components is easy and would not damage the components. For example, two components secured to each other with a limited number of readily accessible fasteners are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true. As used herein, a sensor is capable of being "operatively coupled" to another element. When used in reference to a sensor or similar construct, "operatively coupled" means that the sensor is coupled to the other element in such a manner as to allow the sensor to detect the relevant characteristic that it is structured to sense or detect. Thus, a sensor may not be "directly coupled" to the element it monitors.

As used herein, "characteristics" of elements or assemblies include, but are not limited to, the position of the elements or assemblies, distance moved by one or more of the elements or assemblies, the force generated within or between one or more of the elements or assemblies, or stress within one or more of the elements or assemblies. The measurable characteristic motion may be linear, angular (in 2D or 3D references) and may be convertible to another type of motion with appropriate calibration (factory or field set). The characteristic can be converted into another form (such as, but not limited to, electrical energy, electromechanical energy/force, magnetic, thermal, etc.).

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours.

As used herein, a "computer" is a device structured to process data having at least one input device, e.g., a keyboard, mouse, or touch-screen, at least one output device, e.g., a display, a graphics card, a communication device, e.g., an Ethernet card or wireless communication device, permanent memory, e.g., a hard drive, temporary memory, i.e., random access memory, and a processor, e.g., a programmable logic circuit. The "computer" may be a traditional desktop unit but also includes cellular telephones, tablet computers, laptop computers, as well as other devices, such as gaming devices that have been adapted to include components such as, but not limited to, those identified above. Further, the "computer" may include components that are physically in different locations. For example, a desktop unit may utilize a remote hard drive for storage. Such physically separate elements are, as used herein, a "computer."

As used herein, the word "display" means a device structured to present a visible image. Further, as used herein, "present" means to create an image on a display which may be seen by a user.

As used herein, a "computer readable medium" includes, but is not limited to, hard drives, CDs, DVDs, magnetic tape, floppy drives, and random access memory.

As used herein, "permanent memory" means a computer readable storage medium and, more specifically, a computer readable storage medium structured to record information in a non-transitory manner. Thus, "permanent memory" is limited to non-transitory tangible media.

As used herein, "stored in the permanent memory" means that a module of executable code, or other data, has become functionally and structurally integrated into the storage medium.

As used herein, a "file" is an electronic storage construct for containing executable code that is processed, or, data that may be expressed as text, images, audio, video or any combination thereof.

As used herein, a "module" is an electronic construct used by a computer, or other processing assembly, and includes, but is not limited to, a computer file or a group of interacting computer files such as an executable code file and data storage files, used by a processor and stored on a computer readable medium. Modules may also include a number of other modules. It is understood that modules may be identified by their purpose of function. Unless noted otherwise, each "module" is stored in permanent memory of at least one computer or processing assembly. All modules are shown schematically in the Figures.

As used herein, and in the phrase "[x] moves between a first position and a second position corresponding to [y] first and second positions," wherein "[x]" and "[y]" are elements or assemblies, the word "correspond" means that when element [x] is in the first position, element [y] is in the first position, and, when element [x] is in the second position, element [y] is in the second position. It is noted that "correspond" relates to the final positions and does not mean the elements must move at the same rate or simultaneously. That is, for example, a hubcap and the wheel to which it is attached rotate in a corresponding manner. Conversely, a spring biased latched member and a latch release move at different rates. That is, as an example, a latch release moves between a first position, wherein the latched member is not released, and a second position, wherein the latched member is released. The spring-biased latched member moves between a first latched position and a second released position. The latch release may move slowly between positions and, until the release is in the second position, the latched member remains in the first position. But, as soon as the latch release reaches the second position, the latched member is released and quickly moves to the second position. Thus, as stated above, "corresponding" positions mean that the elements are in the identified first positions at the same time, and, in the identified second positions at the same time.

As used herein, the statement that two or more parts or components "engage" one another shall mean that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality).

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "in electronic communication" is used in reference to communicating a signal via an electromagnetic wave or signal. "In electronic communication" includes both hardline and wireless forms of communication; thus, for example, a "data transfer" or "communication method" via a component "in electronic communication" with another component means that data is transferred from one computer to another computer (or from one processing assembly to another processing assembly) by physical connections such as USB, Ethernet connections or remotely such as NFC, blue tooth etc. and should not be limited to any specific device.

As used herein, "in electric communication" means that a current passes, or can pass, between the identified elements. Being "in electric communication" is further dependent upon an element's position or configuration. For example, in a circuit breaker, a movable contact is "in electric communication" with the fixed contact when the contacts are in a closed position. The same movable contact is not "in electric communication" with the fixed contact when the contacts are in the open position.

As used herein, "generally" means "in a general manner" relevant to the term being modified as would be understood by one of ordinary skill in the art.

As used herein, "substantially" means "for the most part" relevant to the term being modified as would be understood by one of ordinary skill in the art.

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, "at" means on and near relevant to the term being modified as would be understood by one of ordinary skill in the art.

Figure 2:
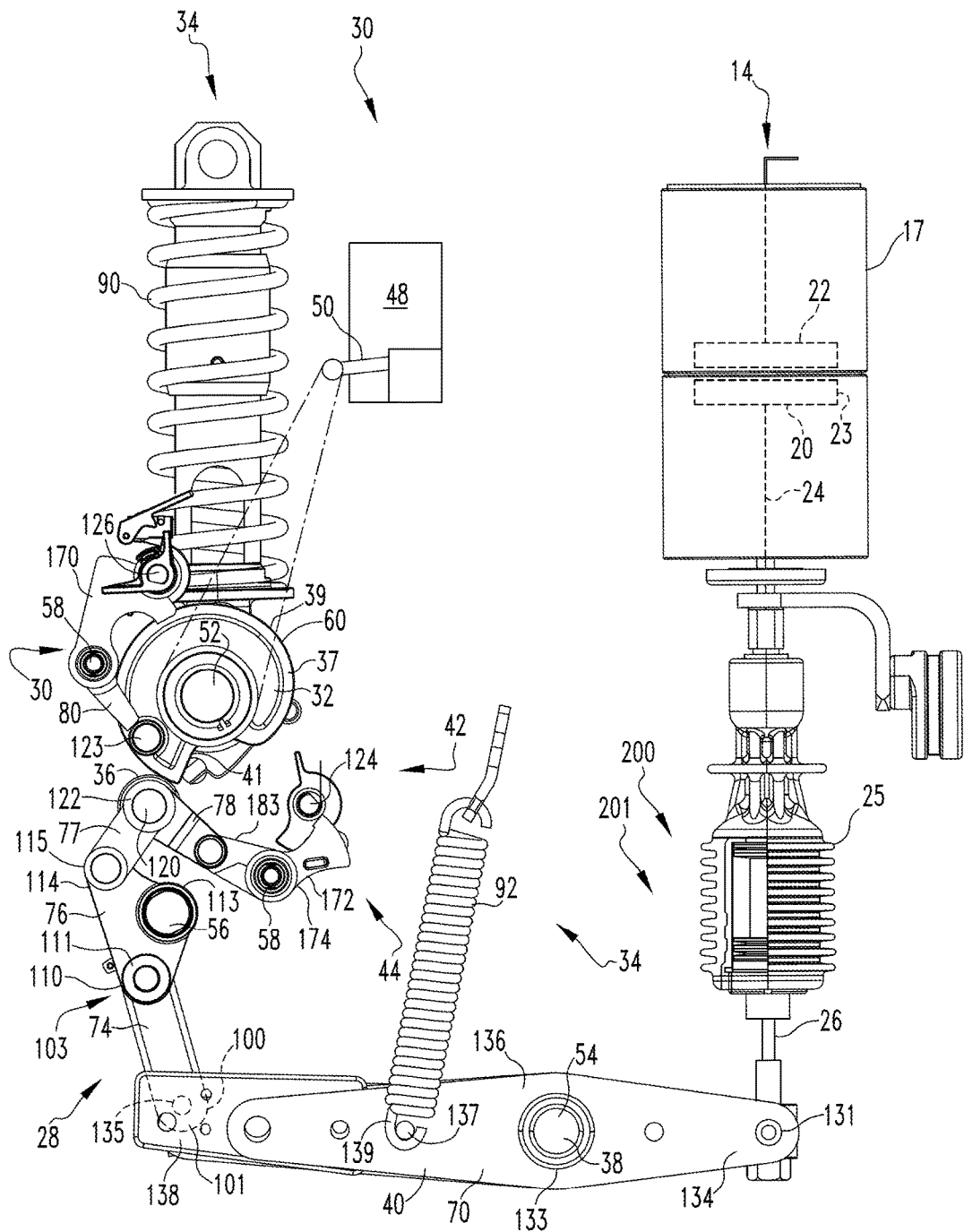
FIG. 2 is a side view of a circuit breaker assembly.
Figure 5:
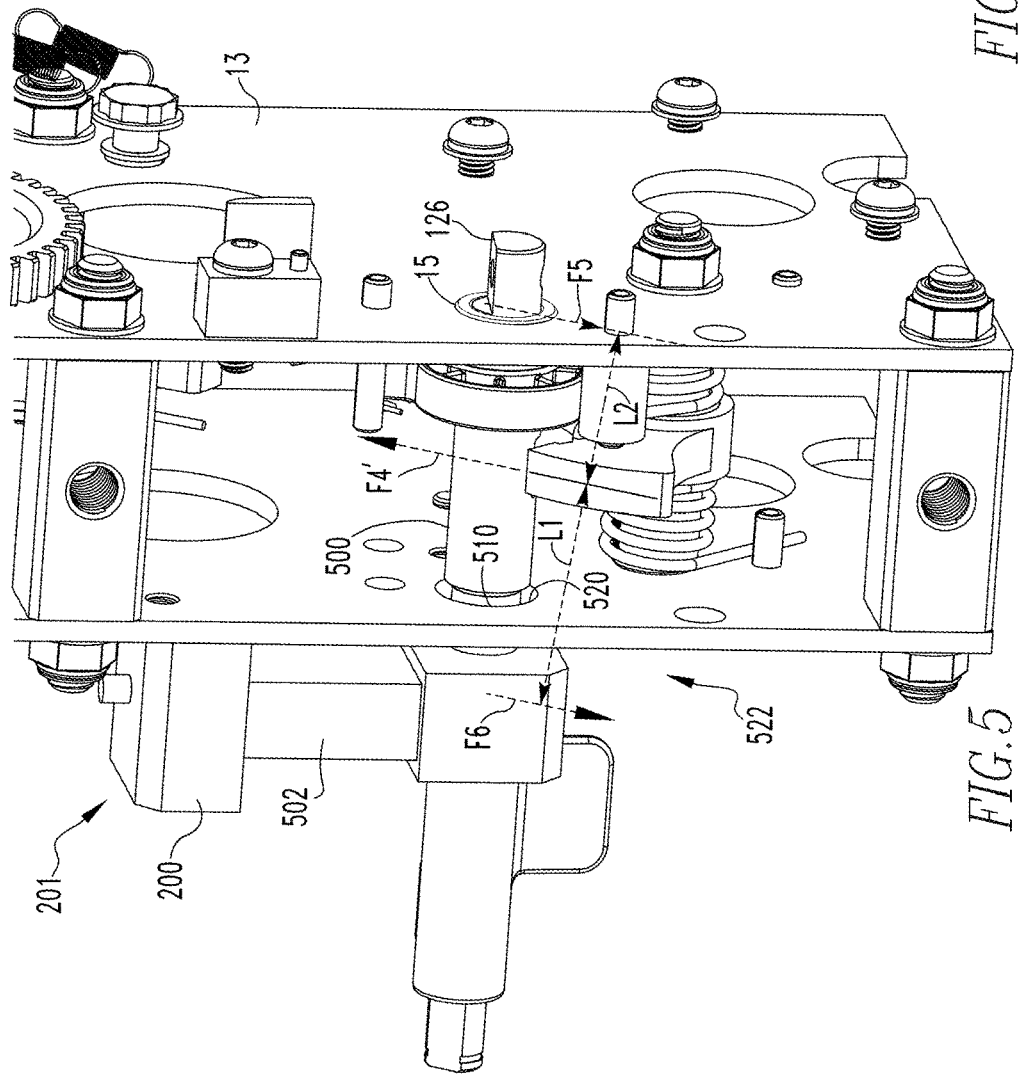
FIG. 5 is an isometric view of a trip latch member showing the forces acting thereon.

A circuit breaker assembly 10 is shown, in part schematically, in FIGS. 1 and 2. The circuit breaker assembly 10 includes a housing assembly 12, a conductor assembly 14, an operating mechanism 16, and a trip assembly 18 (some elements shown schematically). The housing assembly 12 includes a number of sidewalls 13 (hereinafter "circuit breaker sidewall" 13). Selected circuit breaker sidewalls 13 include passages, and in an exemplary embodiment, D-shaft passages 15 (FIG. 5). Generally, D-shaft passages 15 include multiple passages disposed in spaced circuit breaker sidewalls 13. As is known, a D-shaft is rotatably coupled to the circuit breaker sidewall 13 when disposed through aligned D-shaft passages 15. The conductor assembly 14 includes a number of conductive members, discussed below, which are in electrical communication with a line and a load, not shown. In an exemplary embodiment, any "conductive" element is made from a conductive metal such as, but not limited to, copper, aluminum, gold, silver, or platinum. The conductor assembly 14 includes a movable contact assembly 20 and a fixed contact assembly 22 which are disposed in a vacuum chamber 17. The operating mechanism 16 is operatively coupled to the movable contact assembly 20 and is structured to move the movable contact assembly 20 between an open, first position, wherein the movable contact assembly 20 is effectively spaced from the fixed contact assembly 22, and a closed, second position, wherein the movable contact assembly 20 is coupled to, and in electrical communication with, the fixed contact assembly 22.

In an exemplary embodiment, as shown in FIG. 1, the movable contact assembly 20 includes a movable contact member 23, a conductive member 24, a tension pole assembly 25, and an adjustment rod 26 (some elements shown schematically). In an exemplary embodiment, the tension pole assembly 25 includes a housing assembly 82 and a movable element 84. The tension pole assembly housing assembly 82 is coupled, directly coupled, or fixed to the circuit breaker assembly housing assembly 12. In an exemplary embodiment, the tension pole assembly housing assembly 82 is fixed to the circuit breaker assembly housing assembly 12, and is, therefore, stationary. The tension pole assembly movable element 84 is dispose between and coupled, directly coupled, or fixed to the adjustment rod 26 and the movable contact assembly conductive member 24. The tension pole assembly movable element 84 moves between a first and second position along with the movable contact member 23, as described below.

The operating mechanism 16 includes a number of components 28 each of which has a number of characteristics. In an exemplary embodiment, the operating mechanism components 28 include, but are not limited to, a charging motor assembly 30, number of cam members 32, a number of springs 34, a number of cam followers 36, a number of shafts 38, a number of link members 40, a number of D-shafts 42, and a number of latch members 44. It is understood that FIG. 2 is a schematic view showing a limited number of operating mechanism components 28. For example, as is known and in an exemplary embodiment, a circuit breaker assembly 10 includes a number of poles, such as but not limited to three poles. Further, there is a movable contact assembly 20 and a fixed contact assembly 22 associated with each pole. Further, it is understood that each movable contact assembly 20 is coupled to a contact spring 94 (shown schematically), discussed below. It is understood that the contact spring 94 may be disposed within a housing assembly 12 disposed about the movable contact assembly 20. Generally, the operating mechanism 16 moves through a number of configurations, e.g., open, close, trip (contact assembly 20 open and closing spring discharged and thereafter charged), and reset, however, for the purpose of this disclosure the operating mechanism 16 shall be identified as being in either an open, first configuration, or a closed, second configuration; the operating mechanism 16 configurations correspond to the position of the movable contact assembly 20. That is, when the movable contact assembly 20 is in the first position, the operating mechanism 16 is in the first configuration, and, when the movable contact assembly 20 is in the second position, the operating mechanism 16 is in the second configuration.

In an exemplary embodiment, the operating mechanism components 28 are operatively coupled together. Further, the operating mechanism components 28 are operatively coupled to the trip assembly 18. In this configuration, the operating mechanism 16 is structured to move the movable contact assembly 20 between the first position and second position, as noted above. Further, the operating mechanism 16 is structured to move the movable contact assembly 20 from the second position to the first position in response to an overcurrent condition detected by the trip assembly 18. In an exemplary embodiment, the number of springs 34 are structured to cause a rapid movement of the movable contact assembly 20 between positions. That is, generally, a spring 34 is compressed prior to moving the movable contact assembly 20 and, when the movable contact assembly 20 is to be moved, the spring 34 is released causing a rapid movement of the movable contact assembly 20.

The charging motor assembly 30, shown schematically, is, in an exemplary embodiment, an electric motor. The charging motor assembly 30 is coupled to the housing assembly 12. The charging motor assembly 30 includes a rotating output shaft 50. The output shaft 50 is, in an exemplary embodiment, part of the DC motor 48.

The number of shafts 38 includes a cam drive shaft 52 a rocker link shaft 54, a lay shaft 56, a close latch shaft 58 and a trip latch shaft 59. It is understood, and shown schematically, that each shaft 38 is either rotatably coupled to the housing assembly 12 or fixed to the housing assembly 12 (shown in FIG. 1). Thus, it is understood that a rotating shaft 38 rotates about a longitudinal axis of rotation. Conversely, components 28 may rotate about a fixed shaft 38. The charging motor assembly output shaft 50 is operatively coupled to the cam drive shaft 52. As such, actuation of the charging motor assembly 30 causes the cam drive shaft 52 to rotate. As described below, the rocker link shaft 54 is coupled, directly coupled or fixed to a number of rocker link members 70.

The number of cam members 32 includes a first charging cam 60. The first charging cam 60 is coupled, directly coupled or fixed to the cam drive shaft 52 in a fixed orientation. Thus, the first charging cam 60 and the cam drive shaft 52 rotate with each other. That is, actuation of the charging motor assembly 30 causes the first charging cam 60 to rotate. Further, various spring 34 forces, acting through various link members 40, cause the first charging cam 60, and therefore the cam drive shaft 52, to rotate. Rotation of the cam drive shaft 52 does not cause the charging motor assembly output shaft 50 to rotate.

The number of link members 40 includes, but is not limited to, a rocker link member 70, a first link member 74, a lay shaft casting link member 76, a main link coupler member 77, a main link member 78, and a close latch link member 80. Generally, each link member 40 includes an elongated body with a first end and a second end, which will be identified by reference numbers as needed below. A rotational coupling, which will be identified by reference numbers as needed below, is disposed at each link end. A rotational coupling may be any coupling that allows rotation such as, but not limited to an opening in each link end with a pin through both link end openings. Further, each link member 40 includes a longitudinal axis and, if the link member 40 rotates about a shaft or other pivot point, an axis of rotation. As used herein, the "axis of rotation" is disposed at the center of each rotational coupling. Further, as used herein, and with the exception of the casting link member 76, any link member longitudinal axis is disposed between a link's associated axes of rotation.

The rocker link member 70 includes a first end 134, a medial portion 136, and a second end 138. The rocker link member first end 134 includes a first rotational coupling 131 (hereinafter "rocker link member first rotational coupling" 131). The rocker link member medial portion 136 includes a medial rotational coupling 133 (hereinafter "rocker link member medial rotational coupling" 133). The rocker link member second end 138 includes a second rotational coupling 135 (hereinafter "rocker link member second rotational coupling" 135). In an exemplary embodiment, the adjustment rod 26 is rotatably coupled to the rocker link member first end 134 at the first rotational coupling 131. The rocker link member 70 is coupled, directly coupled, or fixed, to the rocker link shaft 54 at the rocker link member medial rotational coupling 133. Further, the rocker link member 70 includes an opening spring mounting 137 disposed between the rocker link member medial portion 136 and a rocker link member second end 138.

The first link member 74 includes a first end 100 and a second end 102. The first link member first end 100 includes a first rotational coupling 101 (hereinafter the "first link member first rotational coupling" 101). The first link member second end 102 includes a second rotational coupling 103 (hereinafter the "first link member second rotational coupling" 103). The lay shaft casting link member 76 is, in an exemplary embodiment, a generally triangular, planar body that includes a first end 110, an offset medial portion 112, and a second end 114. The lay shaft casting link member first end 110 includes a first rotational coupling 111 (hereinafter the "lay shaft casting link member first rotational coupling" 111). The lay shaft casting link member medial portion 112 includes a medial rotational coupling 113 (hereinafter the "lay shaft casting link member medial rotational coupling" 113). The lay shaft casting link member second end 114 includes a second rotational coupling 115 (hereinafter the "lay shaft casting link member second rotational coupling" 115).

The first link member 74 is rotatably coupled to the rocker link member 70. That is, the rocker link member second rotational coupling 135 is rotatably coupled to the first link member first rotational coupling 101. The lay shaft casting link member 76 is rotatably coupled to the first link member 74. That is, the first link member second rotational coupling 103 is rotatably coupled to the lay shaft casting link member first rotational coupling 111. The lay shaft casting link member 76 is also coupled, directly coupled, or fixed to the lay shaft 56. That is, the lay shaft 56 is disposed in the lay shaft casting link member medial rotational coupling 113.

The main link coupler member 77 includes a first end 450 and a second end 452. The main link coupler member first end 450 includes a first rotational coupling 451 (hereinafter the "main link coupler member first rotational coupling" 451). The main link coupler member second end 452 includes a second rotational coupling 453 (hereinafter the "main link coupler member second rotational coupling" 453). The main link member 78 includes a first end 460 and a second end 462. The main link member first end 460 includes a first rotational coupling 461 (hereinafter the "main link member first rotational coupling" 461). The main link member second end 462 includes a second rotational coupling 463 (hereinafter the "main link member second rotational coupling" 463).

The main link coupler member 77 is rotatably coupled to the lay shaft casting link member 76. That is, the main link coupler member first rotational coupling 451 is rotatably coupled to the lay shaft casting link member second rotational coupling 115. Further, the main link coupler member 77 is rotatably coupled to the main link member 78. That is, the main link coupler member second rotational coupling 453 is rotatably coupled to the main link member first rotational coupling 461.

Generally, a latch member 44 is disposed adjacent to a D-shaft 42. When the D-shaft is in a first orientation, the curved portion of the D-shaft surface is disposed in the path of travel of a latch member latching surface. When the D-shaft 42 rotates to a second orientation, wherein the flat portion of the D-shaft surface is disposed adjacent the latch member 44, the D-shaft surface is not disposed in the path of travel of the latch member latching surface. Thus, in one orientation, the D-shaft 42 blocks the travel of the latch member 44. This is the latched orientation of the D-shaft 42 wherein the associated latch member 44 is latched. In the other orientation, the D-shaft 42 does not block the travel of the latch member 44. This is the unlatched orientation of the D-shaft 42 wherein the associated latch member 44 is unlatched.

In an exemplary embodiment, the operating mechanism 16 includes two latch members 44; a close latch member 170 and a trip latch member 172. The following discussion is addressed to the trip latch member 172, but it is understood that the close latch member 170 includes similar elements. The trip latch member 172 operatively engages, and/or is operatively engaged by, the trip latch D-shaft 124, as described above. That is, the trip latch member 172 is movable and includes a body 180 with a first end 182, a medial portion 184, and a latching, second end 186. The trip latch member body 180 is generally shaped as an obtuse, V-like member. The trip latch member body first end 182 includes a rotational coupling 183 (hereinafter the "trip latch member rotational coupling" 183). The trip latch member body medial portion 184 is coupled, directly coupled, or fixed to the trip latch shaft 59. The trip latch member body second end 186 includes a latching surface 188. The trip latch member rotational coupling 183 is rotatably coupled to the main link member second rotational coupling 463.

The trip latch member 172 operatively engages the trip latch D-shaft 124 in the manner discussed above. Thus, when the movable contact assembly 20 is in the second position, force from the contact spring(s) 94 (or other springs 34, in general) acts through the various operating mechanism components 28 on, in an exemplary embodiment, trip latch member 172.

Figure 2A:
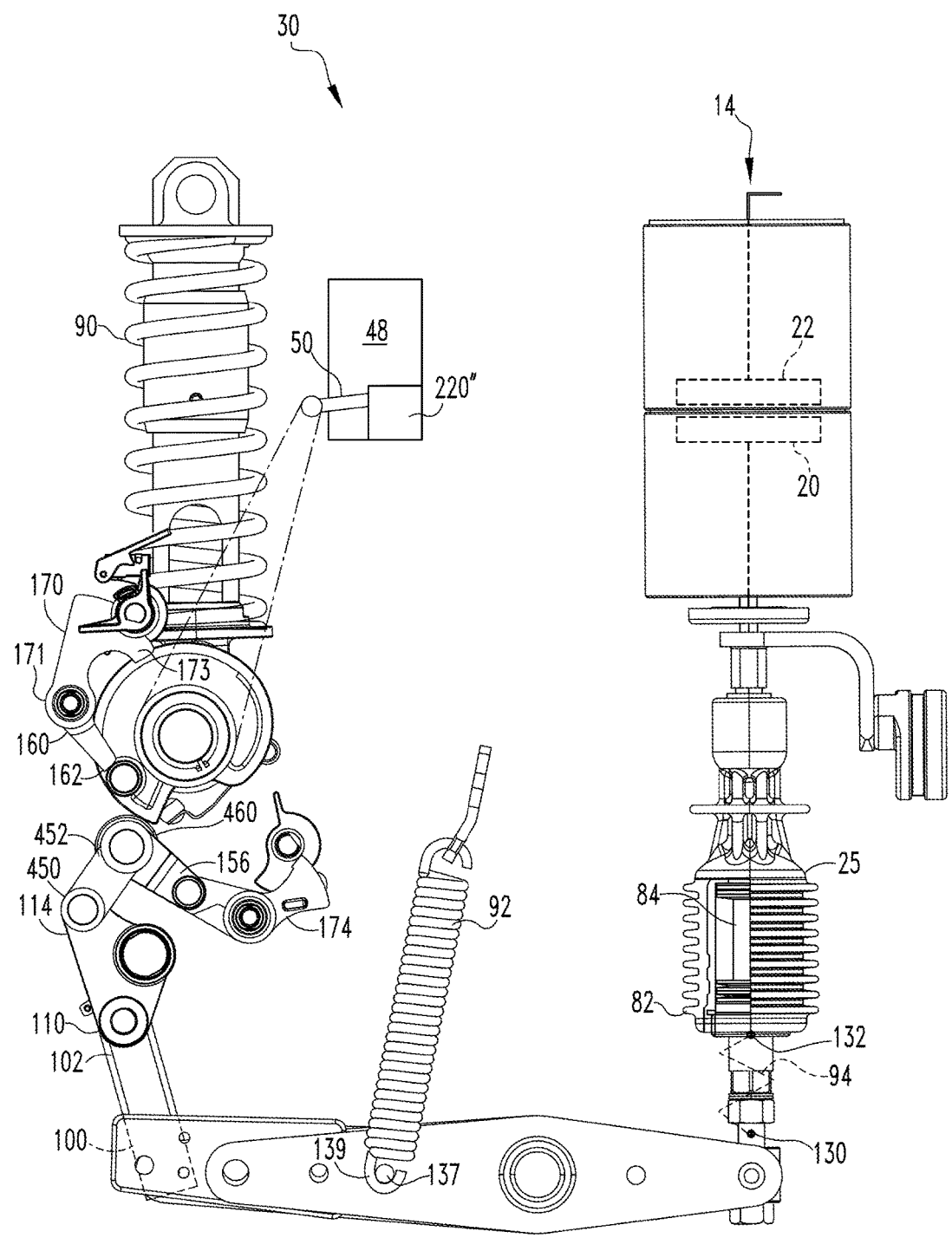
FIG. 2A is a side view of a circuit breaker assembly.

The number of springs 34 includes a closing spring 90, an opening spring 92, and a contact spring 94. Generally, each spring 34 includes a body with a first end and a second end, which will be identified by reference numbers as needed below. As noted above, the schematic side view of FIGS. 2 and 2A shows a single closing spring 90, opening spring 92, and contact spring 94; it is understood that there may be, and typically are, a number of each named spring 90, 92, 94. Each closing spring 90 is charged, i.e., compressed, prior to moving the movable contact assembly 20 from the first position to the second position. That is, each closing spring 90 is charged and the energy is released to rapidly move the movable contact assembly 20 from the first position to the second position. Each opening spring 92 is charged, i.e., compressed, prior to moving the movable contact assembly 20 from the second position to the first position. That is, each opening spring 92 is charged and the energy is released to rapidly move the movable contact assembly 20 from the second position to the first position. The closing springs 90 and the opening springs 92 may be charged at any time prior to the associated movement of the movable contact assembly 20. That is, for example, the opening springs 92 are charged as soon as the movable contact assembly 20 moves to the second position and are maintained in the charged state in the event of an overcurrent condition at a later time. Similarly, the closing springs 90 are charged as soon as the movable contact assembly 20 moves to the second position so that, following an overcurrent condition and subsequent opening of the contact assemblies 20, 22, the movable contact assembly 20 can be returned to the second position. Thus, when the operating mechanism 16 is in the closed configuration, the opening springs 92 apply a "D-shaft force" via the trip latch member 172. As used herein, a "D-shaft force" is any force generated by an operating mechanism acting on a D-shaft.

The contact spring 94 is structured to bias the movable contact assembly 20 toward the fixed contact assembly 22 when the movable contact assembly 20 is in the second position. Thus, during normal operation, i.e., when the movable contact assembly 20 is in the closed, second position and in an exemplary embodiment, the closing spring 90, the opening spring 92, and the contact spring 94 are each charged. Thus, the spring forces, also identified as reactive spring forces, act upon any other operating mechanism components 28 that are operatively coupled to the springs 34.

The number of cam followers 36 includes a closing spring cam follower (not shown) and a main roller 122. It is understood that a cam follower 36 operatively engages a cam member 32, is operatively engaged by a cam member 32, or both. A cam follower 36, in an exemplary embodiment, is a wheel-like roller structured to engage the outer surface of a cam member 32. That is, in an exemplary embodiment, a cam member 32 is a generally planar, disk-like body 37 including a spiral radial surface 39 with an offset 41, i.e., a generally radial step. A cam follower 36 travels over, and engages the cam member body radial surface 39. Thus, because the cam member body radial surface 39 is not a constant distance from the center of the cam member body 37, which is the axis of rotation, the cam follower 36 moves closer or further from the center of the cam member body 37.

The number of D-shafts 42 includes a trip latch D-shaft 124 and a close latch D-shaft 126. Each D-shaft 42 is rotatably coupled to the housing assembly 12. Each D-shaft 42 operatively engages, and/or is operatively engaged by, a latch member 44. The latch members 44 are discussed in detail below. Generally, however, a latch member 44 is movable and includes a latching surface, discussed below, that is disposed adjacent to a D-shaft 42. When the D-shaft is in a first orientation, the curved portion of the D-shaft surface is disposed in the path of travel of the latch member latching surface. When the D-shaft 42 rotates to a second orientation, wherein the flat portion of the D-shaft surface is disposed adjacent the latch member 44, the D-shaft surface is not disposed in the path of travel of the latch member engagement surface. Thus, in one orientation, the D-shaft 42 blocks the travel of the latch member 44. This is the latched orientation of the D-shaft 42 wherein the associated latch member 44 is latched. In the other orientation, the D-shaft 42 does not block the travel of the latch member 44. This is the unlatched orientation of the D-shaft 42 wherein the associated latch member 44 is unlatched.

The movable contact assembly 20 is assembled with the movable contact member 23 coupled to, and in electrical communication with, the conductive member 24. The conductive member 24 is coupled to the tension pole assembly 25, as is known. The adjustment rod 26 is coupled to both, and disposed between, the tension pole assembly 25 and the rocker link member first end 134.

In an exemplary embodiment, the identified operating mechanism components 28 are assembled as follows. A contact spring first end 130, shown schematically, is coupled, directly coupled, or fixed to the movable contact assembly 20. A contact spring second end 132 is coupled, directly coupled, or rotatably coupled to a rocker link member first end 134. An opening spring first end 139 is coupled, directly coupled, or fixed to the rocker link member opening spring mounting 137.

In an exemplary embodiment, the rocker link shaft 54 is rotatably coupled to the housing assembly 12 and the rocker link member 70 is fixed to the rocker link shaft 54. The rocker link member second end 138 is coupled, directly coupled, or rotatably coupled to a first link member first end 100. A first link member second end 102 is coupled, directly coupled, or rotatably coupled to a lay shaft casting link member first end 110. An offset lay shaft casting link member medial portion 112 is rotatably coupled to the lay shaft 56. The lay shaft 56 is coupled, directly coupled, or fixed to the housing assembly 12. A lay shaft casting link member second end 114 is coupled, directly coupled, or rotatably coupled to a main link coupler member first end 450. A main link coupler member second end 452 is coupled, directly coupled, or rotatably coupled to a main link member first end 460. Further, the main roller 122 is rotatably coupled to a rotational coupling at the interface of the main link coupler member second end 152 and the main link member first end 460. A main link member second end 462 is coupled, directly coupled, or rotatably coupled to a trip latch member body latching first end 181.

Further, the first charging cam 60 is fixed to the cam drive shaft 52, as described above. The first charging cam 60 is disposed adjacent to the main roller 122. That is, the first charging cam 60 is disposed so that the main roller 122 operatively engages the first charging cam member body radial surface 39. A close latch member 170, discussed below, is disposed adjacent to the first charging cam 60. In an exemplary embodiment, the close latch member 170 is rotatably coupled to the close latch shaft 58. The close latch shaft 58 is coupled, directly coupled, or fixed to the housing assembly 12. A close latch link member first end 160 is coupled, directly coupled, or rotatably coupled to a trip latch member first end 182, discussed below. A close latch link member second end 171 is rotatably coupled to the close latch follower 123.

The configuration described above is an exemplary embodiment of an operating mechanism 16 that is structured to move the movable contact assembly 20 between an open, first position, wherein the movable contact assembly 20 is effectively spaced from the fixed contact assembly 22, and a closed, second position, wherein the movable contact assembly 20 is coupled to, and in electrical communication with, the fixed contact assembly 22. Movement of the movable contact assembly 20 may be intentionally initiated or be in response to an overcurrent condition, i.e., initiated by the trip assembly 18. It is understood that when the movable contact assembly 20 is in the first position, the rocker link member 70 and the adjustment rod 26 are also in a first position, and, when the movable contact assembly 20 is in the second position, the rocker link member 70 and the adjustment rod 26 are also in a second position.

The circuit breaker assembly 10, and in an exemplary embodiment the operating mechanism 16, includes a failure prediction assembly 200 structured to monitor a number of circuit breaker assembly components' characteristics including those of operating mechanism 16 as exemplified above. In an exemplary embodiment, the failure prediction assembly 200 is a displaced failure prediction assembly 201. As used herein, a "displaced failure prediction assembly" 201 means a system wherein a first component is monitored so as to diagnose a characteristic of a different, second component. Generally, a failure prediction assembly 200 is structured to measure a component characteristic, such as, but not limited to, the force generated by a charged spring 34 while in the second configuration. Further, the failure prediction assembly 200 compares the measured component characteristic to a selected nominal component characteristic. The "selected nominal" component characteristic data, alternatively "selected nominal data," as used herein, are determined via use, testing or determined theoretically and is utilized as a standard template against which the acquired data is compared. The "selected nominal data" may be defined specifically, as a range, a specific number (i.e., a number representing a measured characteristic) or as a coefficient. As used herein, "selected nominal data" may be associated with any component characteristic. Further, data acquired or collected during use of a circuit breaker assembly 10 is, as used herein, "acquired selected nominal data." Further, data acquired or collected during use of the circuit breaker assembly 10 to which the failure prediction assembly 200 is coupled is, as used herein, "acquired local selected nominal data."

Figure 3:
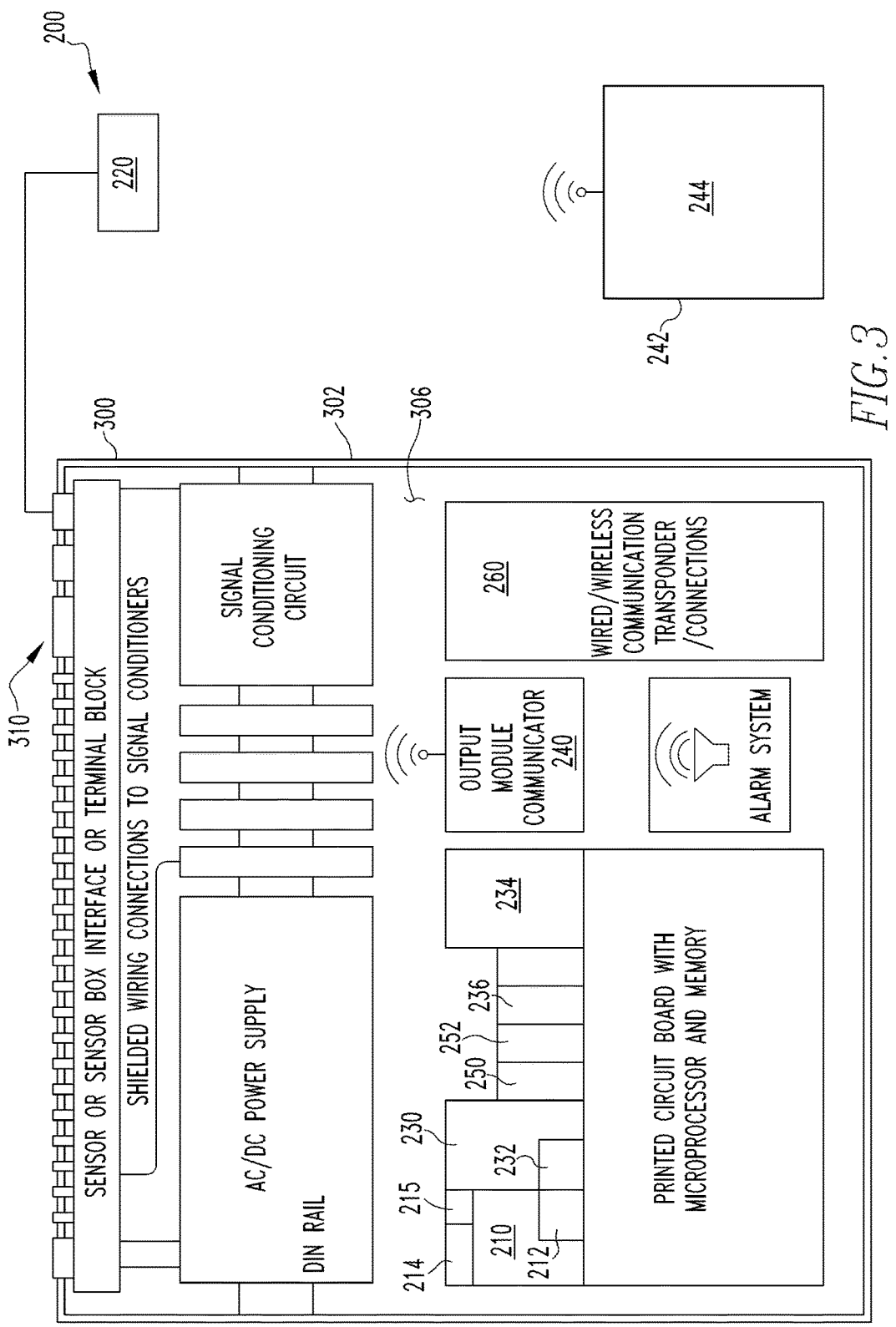
FIG. 3 is a schematic view of a component monitoring system.
Figure 4:
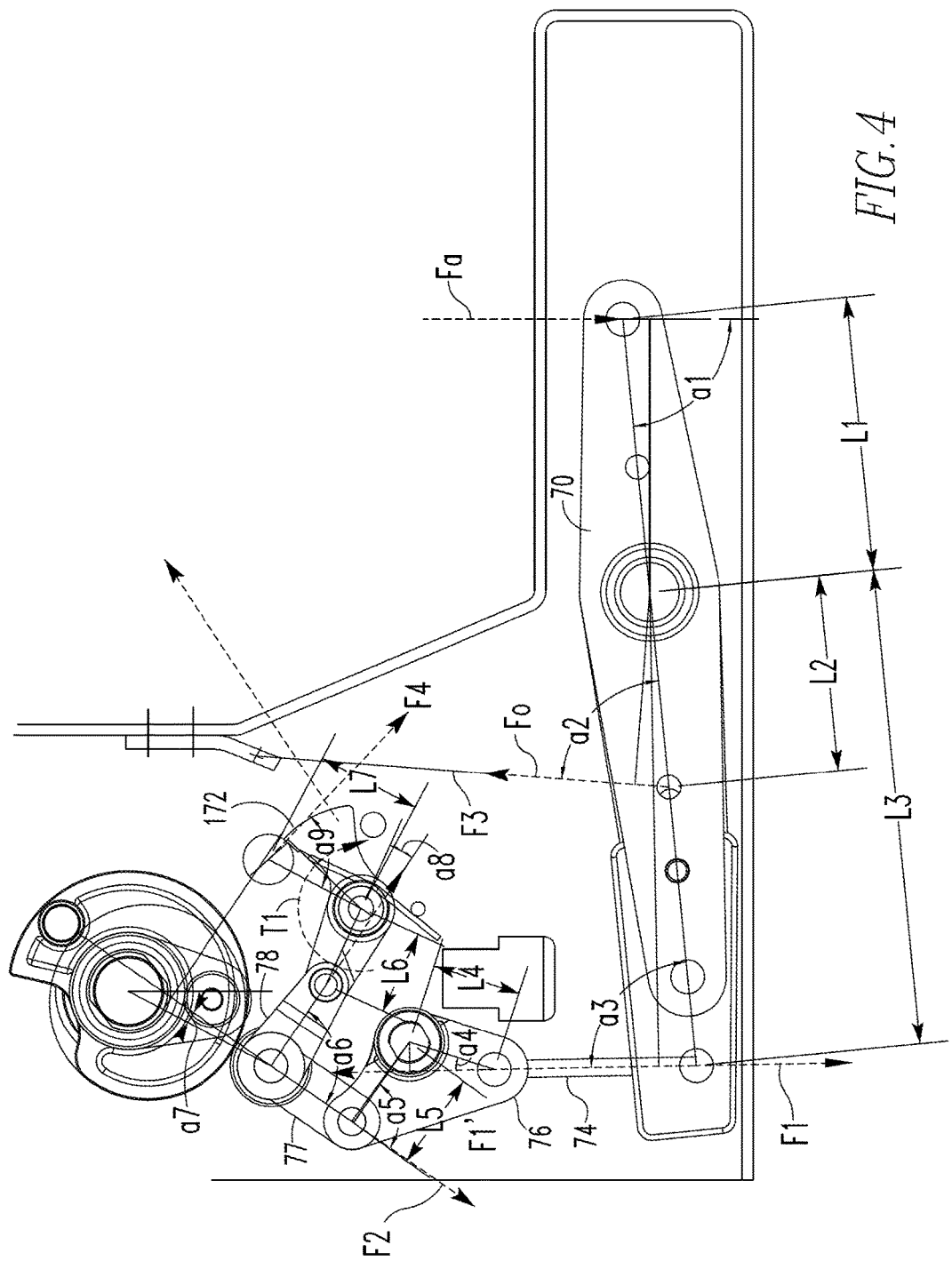
FIG. 4 is a side view of a circuit breaker assembly of FIG. 2 showing the forces acting thereon.
Figure 4A:
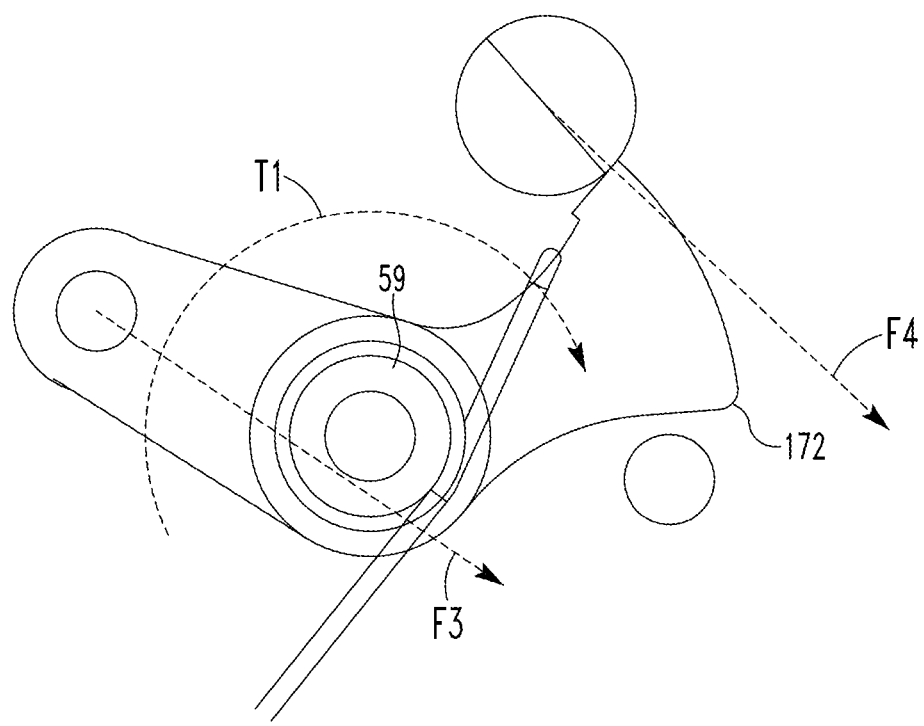
FIG. 4A is a detail view of the trip latch member showing the forces acting thereon.

Generally, and as shown in FIG. 3, the failure prediction assembly 200 includes a record assembly 210, at least one sensor assembly 220, or a number of sensor assemblies 220, a comparison assembly 230, an output assembly 240, and a Force/Torque Balance assembly 250 (hereinafter a "FTB assembly" 250). As discussed below, in an exemplary embodiment, the record assembly 210, the comparison assembly 230, and the output assembly 240 are collectively identified as a control unit 202. It is understood that any communication between an element and any element of the control unit 202 is also a communication with the control unit 202. Further, it is understood that all elements of the control unit 202 are in electronic communication with each other.

The record assembly 210 is, in an exemplary embodiment, a database module 212 stored in a memory assembly 214 and/or permanent memory assembly 215. As used herein, the memory assembly 214 and/or permanent memory assembly 215 include any electrical memory device such as, but not limited to, a magnetic drive, flash memory, or an optical drive, but does exclude transitory media. The record assembly 210, and in an exemplary embodiment the database module 212, includes data representing selected nominal data of a number of selected operating mechanism components 28. Further, the database module 212 is structured to be updated. That is, the selected nominal data may be replaced or amended, e.g., additional data may be added to the selected nominal data.

The record assembly 210 is, in an exemplary embodiment, also in electronic communication with the output assembly 240. For example, if the output assembly 240 includes a display 244, the record assembly 210 is in electronic communication with the display 244 and is structured to present data on the display 244.

In an exemplary embodiment, each sensor assembly 220 includes a number of sensors 203. Further, each sensor assembly 220 includes, or is structured to be coupled to and in electronic communication with, a power source (not shown). The power source may be disposed within each sensor assembly 220. Further, each sensor assembly 220 is structured to measure a number of "actual component characteristics," as defined below, of a sub-assembly of the circuit breaker assembly 10, such as, but not limited to a selected operating mechanism component 28. The component characteristics that are physically measured, such as, but not limited to, deformation of the sub-assembly of the circuit breaker assembly 10, such as, but not limited to a selected operating mechanism component 28 are the "measured component characteristics" as used herein. Further, a sub-assembly of the circuit breaker assembly 10, such as, but not limited to a selected operating mechanism component 28 may be associated with more than one sensor assembly 220. Generally hereinafter, however, as an initial example and for simplicity, it is assumed that there is a single sensor assembly 220 structured to measure a single actual component characteristic. The sensor assembly 220 is further structured to transmit output data representing the selected circuit breaker component's actual component characteristic. In this exemplary embodiment, the output data is an electronic construct such as, but not limited to, a signal. Hereinafter, the "output data representing the selected circuit breaker component's actual component characteristic" is identified as "actual component characteristic output data." That is, as used herein, "actual component characteristics" means the measured component characteristics which is then, in an exemplary embodiment, represented by the actual component characteristic output data. It is understood that the sensor assembly 220 uses the "actual component characteristics" to generate "actual component characteristic output data" representing the "actual component characteristics." As such, these two terms are generally interchangeable. In an exemplary embodiment, the actual component characteristic output data signal has characteristics of between about 0-10V DC, between about 4-20 mA and between about 100-1000 Hz, or, digital signal output. As stated, this is an example and is not limiting.

The FTB assembly 250 includes, in an exemplary embodiment, an FTB (Force/Torque Balance) module 252 stored in a memory assembly 214 and/or permanent memory assembly 215. As used herein, the memory assembly 214 and/or permanent memory assembly 215 include any electrical memory device such as, but not limited to, a magnetic drive, flash memory, or an optical drive, but does exclude transitory media. The FTB assembly 250, in an exemplary embodiment, is unitary with the record assembly 210 and/or the comparison assembly 230. The FTB module 252 includes a number of equations, hereinafter "FTB equations," discussed in detail below. In an exemplary embodiment, the FTB assembly 250, and in an exemplary embodiment the FTB module 252, is structured to perform a number of functions using the FTB equations to determine "calculated component characteristics." As used herein, "calculated component characteristics" means component characteristics based on measured component characteristics and equations such as, but not limited to, the equations set forth below. As used herein, "perform a number of functions" means to take measured component characteristics and apply a number of equations thereto so as to generate calculated component characteristics based on the measured component characteristics. Further, the FTB assembly 250, and in an exemplary embodiment the FTB module 252, stores the "calculated component characteristics" electronically as "calculated component characteristics data." As with the terms "actual component characteristics" and "actual component characteristic output data," the terms "calculated component characteristics" and "calculated component characteristics data" are generally interchangeable.

The comparison assembly 230 includes a processing assembly 232, an input/output device 234, and a comparison module 236. The processing assembly 232 includes a programmable logic circuit, memory, and an infrastructure, such as, but not limited to a printed circuit board (none shown). As used herein, a "processing assembly" is not a general purpose computer. The processing assembly 232 is structured to execute the comparison module 236.

The comparison module 236, when executed, is structured to acquire the selected nominal data for the selected component from the record assembly 210 and the calculated component characteristics from the FTB assembly 250.

That is, the comparison assembly 230, and in an exemplary embodiment the comparison module 236, is in electronic communication with the record assembly 210 and is structured to access the selected nominal data within the record assembly 210. Further, the comparison assembly 230, and in an exemplary embodiment the comparison module 236, is in electronic communication with the FTB assembly 250 and is structured to access the calculated component characteristics within the FTB assembly 250. The comparison assembly 230, and in an exemplary embodiment the comparison module 236, is further structured to compare the calculated component characteristics and the selected nominal data and to determine if each calculated component characteristic is unacceptable. That is, as used herein, calculated component characteristics are "unacceptable" if the calculated component characteristics do not compare favorably to the selected nominal data. For example, if the selected nominal data is in the form of a range, and the calculated component characteristic is outside of the range, the calculated component characteristic is "unacceptable." Further, if the selected nominal data is in the form of a limit, e.g., a maximum, and the calculated component characteristic is above that maximum, the calculated component characteristic is "unacceptable." The comparison assembly 230 is further structured to communicate a signal to the output device 242.

That is, the comparison module 236 is further structured to generate an output signal. The output signal, in an exemplary embodiment, represents indication of the acceptability of the calculated component characteristics when compared to the selected nominal data.

The comparison assembly input/output device 234 is in electronic communication with the record assembly 210, the processing assembly 232, and the FTB assembly 250 as well as all sensor assemblies 220. Thus, the comparison assembly input/output device 234 allows for communication between these elements. Further, the comparison assembly input/output device 234 is in electronic communication with the output assembly 240.

The output assembly 240 includes an output device 242, such as, but not limited to a display 244. The output assembly 240 is structured to present an indication that the actual component characteristic is either acceptable or not acceptable. For example, the indication may be an image of a green checkmark if the actual component characteristic is acceptable, or the indication may be an image of a red "X" if the actual component characteristic is not acceptable. As another example, the indication may include an image of an envelope showing an acceptable component characteristic as well as an image representing the actual component characteristic, e.g., a curve representing the actual component characteristic over a period of time. If the image representing the actual component characteristic is disposed within the envelope, the actual component characteristic is acceptable, or, if the image representing the actual component characteristic, or a portion thereof, is disposed outside the envelope, the actual component characteristic is not acceptable.

Further, the output assembly 240, in an exemplary embodiment, includes a communication assembly 260 or electronic communication between any sub-assemblies. The communication assembly 260 is structured to communicate the output signal to a remote location. The communication assembly 260 is further structured to communicate raw data or any other stored information to a remote location. The communication assembly 260 may communicate the signal via wired constructs, such as, but not limited to, fiber optics, Ethernet cables, shielded cables, CAN-BUS communication system, or wireless constructs, such as, but not limited to, Near Field Communications (NFS), blue tooth connections, WiFi connections, Radio Frequency identifications (RFID), satellite communications systems, or radio communication systems.

In an embodiment wherein the sensor assemblies 220 utilize wired communication, the modular housing assembly 300 includes a number of communication ports 310. Each modular housing assembly communication port 310 is in electronic communication with the processing assembly 232. Further, each modular housing assembly communication port 310 is structured to be in, and is placed in, electronic communication with a sensor assembly 220.

In an exemplary embodiment, the failure prediction assembly 200 is structured to evaluate the closing spring 90 so as to determine when the closing spring 90 is worn and/or ready for replacement. In this example, the close latch D-shaft 126 is a sensor supported 1-shaft 500. That is, in this embodiment, the sensor assembly 220 includes a housing 502 and a number of sensors 504 such as, but not limited to stress sensors 506. In an exemplary embodiment, the sensor assembly 220 is structured to measure force in a range of about 0 (zero) to 300 (three hundred) Newtons. The sensor assembly housing 502 defines a D-shaft passage 510. The sensor assembly housing 502 is coupled to the housing assembly 12, and, as shown, to a sidewall 13. The sensor assembly housing 502 coupled to said circuit breaker sidewalls 13 with the sensor assembly housing D-shaft passage 510 aligned with the circuit breaker sidewall D-shaft passages 15. That is, as used herein, "aligned with the circuit breaker sidewall D-shaft passages" means that a D-shaft disposed through the circuit breaker sidewall D-shaft passages 15 would also extend through the sensor assembly housing D-shaft passage 510; that is, the centers of the passages 15, 510 are generally disposed along a single line.

Further, in this embodiment, the sensor supported D-shaft 500 includes a number of sidewall portions 520. As used herein, a "sidewall portion" of a shaft that is rotatably coupled to a sidewall means that portion of the shaft that is disposed within the plane defined by the sidewall. Further, a "sidewall portion" of a shaft that is rotatably coupled to a sidewall means that the portion of the shaft that is disposed within the plane defined by the sidewall has a smaller cross-sectional area compared to the passage through the sidewall which the shaft extends. In an exemplary embodiment, the sensor supported D-shaft 500 has a single sidewall portion 520 which is identified herein as the "sensor assembly sidewall portion" 522.

The close latch D-shaft 126, which, in an exemplary embodiment, is a sensor supported D-shaft 500 having a single sidewall portion 520, is rotatably coupled to the housing assembly 12. That is, the close latch D-shaft 126 is disposed through the circuit breaker sidewall D-shaft passages 15 as well as the sensor assembly housing D-shaft passage 510. The sensor assembly sidewall portion 522 is disposed adjacent to the sensor assembly housing 502. In this configuration, the close latch D-shaft 126 does not contact the circuit breaker sidewall D-shaft passage 15 adjacent to the sensor assembly housing 502. Thus, the sensor assembly housing 502 supports the close latch D-shaft 126. Thus, forces acting on the close latch D-shaft 126 generate reactive forces in the sensor assembly housing 502. Further, the sensor assembly number of sensors 504 are structured to, and do, detect the forces and reactive forces acting on the close latch D-shaft 126 and the sensor assembly housing 502. As noted above, each sensor 504 is structured to, and does, measure a number of actual component characteristics and generates actual component characteristic output data.

The actual component characteristic output data is communicated to the FTB assembly 250 and the FTB module 252. The FTB module 252 converts the actual component characteristic output data to calculated component characteristics data. That is, as noted above, the FTB module 252 includes a number of FTB equations. The FTB equations are determined based upon the configuration of the circuit breaker assembly 10. In an exemplary embodiment, and for a circuit breaker assembly 10 having the configuration shown in FIGS. 2-3, the following characteristics are noted. Further, it is noted that the identified lengths are measured from the center, i.e., the axis of rotation, of each identified rotational coupling or shaft, or, the center of any other coupling. Further, while one rotational coupling is identified below, it is understood that the rotational coupling to which the identified rotational coupling is rotatably coupled could also be used to identify the length. That is, for example, the list below identifies L3 as the length between the rocker link member medial rotational coupling 133 and the first link member first rotational coupling 101; as the first link member first rotational coupling 101 is coupled to the rocker link member second rotational coupling 135, L3 is also the length between the rocker link member medial rotational coupling 133 and the rocker link member second rotational coupling 135.

L1 is a first length and is associated with force Fa on rocker link member 70, and, is the length between the rocker link member first rotational coupling 131 and the rocker link member medial rotational coupling 133.

L2 is a second length and is associated with force of Fo on rocker link member 70, and, is the length between the rocker link member medial rotational coupling 133 and the opening spring mounting 137.

L3 is a third length and is associated with force F1 on rocker link member 70, and, is the length between the rocker link member medial rotational coupling 133 and the first link member first rotational coupling 101.

L4 is a fourth length and is associated with force F1 on lay shaft casting link member 76, and, is the length between the lay shaft casting link member first rotational coupling 111 and the lay shaft casting link member medial rotational coupling 113.

L5 is a fifth length and is associated with force F2 on lay shaft casting link member 76, and, is the length between the lay shaft casting link member medial rotational coupling 113 and the lay shaft casting link member second rotational coupling 115.

L6 is a sixth length and is associated with force F3 on trip latch member 172, and, is the length between the main link member second rotational coupling 463 and the trip latch shaft 59.

L7 is a seventh length and is associated with force F4 on trip latch member 172, and is the length between the trip latch shaft 59 and the trip latch D-shaft 124.

Further, when the operating mechanism 16 is in the second configuration, the various springs 34 generate forces and torque in the elements of the operating mechanism 16. Further, it is understood that the identified forces also have reactive force acting on the elements coupled to the identified elements. These forces and torque include:

Fa is the force acting on the rocker link member first rotational coupling 131 and is the direction of the longitudinal axis of the tension pole assembly 25.

F0 is the force acting on the opening spring mounting 137.

F1 is the force acting on the first link member first rotational coupling 101 and is the direction of the longitudinal axis of the first link member 74.

F1' is the reactive force acting on the first link member second rotational coupling 103 and is the direction of the longitudinal axis of the first link member 74. That is, F1 and F1' are always the same force acting in opposite directions.

F2 is the force acting on the main link coupler member first rotational coupling 451 generated by (or through) main link coupler member 77 and is the direction of the longitudinal axis of the main link coupler member 77.

F3 is the force acting on the main link member second rotational coupling 463 generated by (or through) main link member 78 and is the direction of the longitudinal axis of the main link member 78.

F4 is the force acting on the trip latch member body second end 186 and, as shown, the trip latch member body second end latching surface 188, generated by (or through) the trip latch D-shaft 124 and is the direction of a line perpendicular to the interface of the trip latch D-shaft 124 and the trip latch member body second end latching surface 188.

T1 is the torque of the trip latch shaft 59.

Further, the following angles are noted:

$\alpha_1$ is the angle between the direction of Fa and L1.

$\alpha_2$ is the angle between the direction of F0 and L2.

$\alpha_3$ is the angle between the direction of F1 and L3.

$\alpha_4$ is the angle between the direction of F1' and a line extending between lay shaft casting link member first rotational coupling 111 and the lay shaft casting link member medial rotational coupling 113.

$\alpha_5$ is the angle between the direction of F2 and a line extending between lay shaft casting link member second rotational coupling 115 and the lay shaft casting link member medial rotational coupling 113.

$\alpha_6$ is the angle between the longitudinal axis of main link coupler member 77 and the longitudinal axis of main link member 78.

$\alpha_7$ is the angle between the connecting line between center of cam drive shaft 52 and center of main link coupler member second rotational coupling 453 and the reverse of the line representing F2 (i.e., the connecting line between the center of main link coupler member first rotational coupling 451 and the center of the main link coupler member second rotational coupling 453.

$\alpha_8$ is the angle between the connecting line between center of trip latch shaft 59 and of the center of main link coupler member second rotational coupling 453.

$\alpha_9$ is the angle between the direction of F4 and the connecting line between center of trip latch shaft 59 and center of trip latch D-shaft 124.

Thus, for a circuit breaker assembly 10 in this configuration, the following force and torque balance equations are relevant, and are the equations incorporated into the FTB module 252.

$$Fa*L1*\sin\alpha_1 + Fo*L2*\sin\alpha_2 = F1*L3*\sin\alpha_3$$

$$F1*L4*\sin\alpha_4 = F2*L5*\sin\alpha_5$$

$$F2*\sin\alpha_7 = F3*\sin(\alpha_6-\alpha_7)$$

$$F3*L6*\sin\alpha_8 = F4*L7*\sin 9 + T1$$

Based on these equations, the relation can be obtained:

$$F4=\{((Fa*L1*\sin\alpha_1+Fo*L2*\sin\alpha_2)\cdot L4*\sin\alpha_4 * \sin\alpha_7*L6\sin\alpha/(L3*\sin\alpha_3*L5*\sin\alpha_5*\sin(\alpha^6-\alpha^7)))-T1\}/(L7*\sin\alpha_9)$$

That is, these equations show there is a defined relationship between Fa and F4

As shown in FIG. 5, a sensor supported D-shaft 500 is structured to determine the reactive force, herein identified as F4'. That is, the force acting on the trip latch member body second end 186 has a reactive force acting on the sensor supported D-shaft 500. Thus, the sensor assembly 220 can measure the pressure of the trip latch member 172 in the closed position without any further interference from the basic operation of the operating mechanism 16. Further, as shown in FIG. 5, there is also force acting on the circuit breaker sidewall 13 that defines the aligned D-shaft passage 15 opposite the sensor assembly housing D-shaft passage 510; identified herein as F5. Further, F6 is the force, or reactive force, from the sensor assembly 220 on the sensor supported D-shaft 500.

Accordingly, the following equations are also applicable:

$$F4'=F6+F5$$

$$F4'*L1=F5*L2$$

$$F6*L1=F5*L2$$

$$F6*L1=F5*L2$$

Thus:

$$F4'=L2/(L1+L2)*F6$$

or $$F6=L2/(L1+L2)*F4'$$

Figure 6:
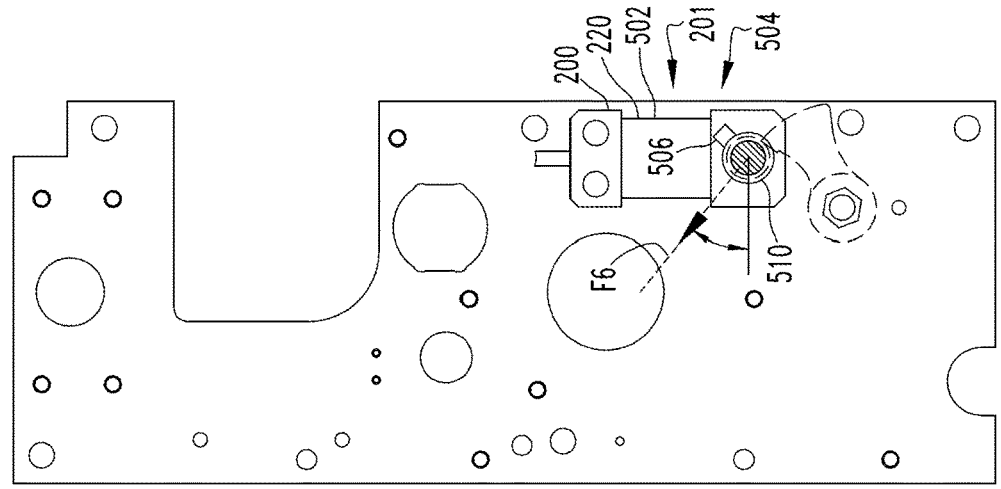
FIG. 6 is a side view of a sensor assembly coupled to the trip latch D-shaft.

Further, the sensor assembly 220 is shown as mounted in two exemplary orientations; vertical (FIGS. 5 and 6) and non-vertical (FIGS. 7 and 8). As noted above, the sensor assembly 220 measures a force, identified herein as "$F_{Measured}$". As used herein, and in reference to the orientation of the sensor assembly 220, "vertical" and "non-vertical" relate to the force measuring direction of the sensor assembly 220. That is, direction of $F_{measure}$ is always vertical to the symmetrical centerline of the sensor assembly 220. That is, in the "vertical" orientation, $F_{measure}=F6*\cos\omega=L2*F4'\cos\omega/(L1+L2)$ whereas in the "non-vertical" orientation, $F_{measure}=F6=L2*F4'/(L1+L2)$. Stated alternately, "vertical" means the symmetrical centerline of the sensor is vertical to the bottom edge/margin of the housing side panel 13; "non-vertical" is the orientation when $F_{measure}$ and F6 coincide ($\omega=0$). Further, the angle $\omega$, as shown in FIG. 6, represents the included, angle of $F_{measure}$ and F6. Accordingly, for a sensor assembly 220 in a vertical orientation:

$$F_{Measured}=F2*\cos\omega=L2*F1*\cos\omega(L1+L2)$$

For a sensor assembly 220 in a non-vertical orientation:

$$F_{Measured}=L2*F4(L1+L2).$$

Thus, the force measured by sensor assembly 220 is used to determine F4 and/or $F_O$. That is, $F_{measured}$ is related with F4. According to the equation:

$$F4=\{((Fa*L1*\sin\alpha1+Fo*L2*\sin\alpha2)\cdot L4*\sin\alpha4*\sin\alpha7*L6\sin\alpha/(L3*\sin\alpha3*L5*\sin\alpha5*\sin(\alpha6-\alpha7)))-T1\}/(L7*\sin\alpha9).$$

Accordingly, F4 is related to Fa. As such, when there is a phase missing fault or other damage, Fa will decrease, and $F_{measure}$ will also decrease. F4 is also related with Fo. So in open spring fault or other damage, Fo will change, thus $F_{measure}$ will also change. Generally, the variable quantity of these two faults are different and a control unit 202 is structured to identify the difference. Accordingly, the failure prediction assembly 200 structured to identify a phase missing fault or an open spring fault based on changes to the force measured by sensor assembly 220. Detection of such faults provides an indication of the "health" of the circuit breaker assembly 10 and solves the problems stated above.

It is noted that the example above relates to forces acting directly on the trip latch member 172. It is understood that this is an example and other equations could be used to determine forces acting the operating mechanism via measuring the force acting on a different specific element, e.g., the close latch D-shaft 126 could be a sensor supported D-shaft 500.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A failure prediction assembly for a circuit breaker, said circuit breaker including an operating mechanism with a number of springs, a number of link members, and a number of circuit breaker sidewalls, said operating mechanism structured to move between an open, first configuration and a closed, second configuration, wherein, said number of springs include opening springs and closing springs, said number of link members includes a trip latch member, said circuit breaker sidewalls defining a pair of aligned D-shaft passages, wherein, when said operating mechanism is in said closed configuration, said opening springs apply a D-shaft force via said trip latch, said failure prediction assembly comprising:
   a sensor supported D-shaft;
   a sensor assembly including a housing and a number of sensors;
   said sensor assembly housing defining a D-shaft passage;
   a control unit, said control unit in electronic communication with said sensor assembly;

said sensor assembly housing coupled to said circuit breaker sidewalls with said sensor assembly housing D-shaft passage aligned with said circuit breaker sidewall D-shaft passages; and said sensor supported D-shaft rotatably coupled to said sensor assembly with said sensor supported D-shaft disposed through said sensor assembly housing D-shaft passage.

2. The failure prediction assembly of claim 1 wherein:
said sensor supported D-shaft includes a number of sidewall portions;
said sensor supported D-shaft number of sidewall portions including a sensor assembly sidewall portion; and
wherein said sensor supported D-shaft sidewall sensor assembly sidewall portion has a smaller cross-sectional area than the associated circuit breaker sidewall D-shaft passage.

3. The failure prediction assembly of claim 1 wherein:
said control unit includes a record assembly, a comparison assembly, an FTB assembly and an output assembly;
said control unit structured to receive a sensor signal from each sensor in said number of sensors and to provide actual component characteristic output data to said FTB assembly;
said control unit structured to send an alert signal to said output assembly;
said FTB assembly structured to perform a number of functions to said actual component characteristic output data to generate calculated component characteristics;
a comparison assembly structured to receive an electronic signal from said record assembly and said FTB assembly to compare said calculated component characteristics to selected nominal data and to provide an indication signal as to whether said calculated component characteristics is acceptable when compared to the selected nominal data; and
wherein, if any calculated component characteristics is unacceptable, said control unit sends an alert signal to said output assembly.

4. The failure prediction assembly of claim 3 wherein each said sensor in said sensor assembly number of sensors is operatively coupled to the same link member.

5. The failure prediction assembly of claim 3 wherein each said sensor in said sensor assembly number of sensors is operatively coupled to said sensor supported D-shaft.

6. The failure prediction assembly of claim 5 wherein said sensor assembly is structured to determine a single actual component characteristic of said sensor supported D-shaft.

7. The failure prediction assembly of claim 6 wherein:
said FTB assembly includes an FTB module;
said FTB module structured to perform a number of functions to said actual component characteristic output data to generate calculated component characteristics; and
wherein said FTB module calculates linkage characteristics for link members other than said sensor supported D-shaft.

8. The failure prediction assembly of claim 6 wherein said single actual component characteristic of said sensor supported D-shaft determined by said sensor assembly is a reactive trip latch force.

9. The failure prediction assembly of claim 6 wherein said FTB module includes the Eaton Equations.

10. The failure prediction assembly of claim 6 wherein said sensor assembly is mounted in one of a vertical orientation or a non-vertical orientation.

11. A circuit breaker comprising:
an operating mechanism with a number of springs, a number of link members, and a number of circuit breaker sidewalls;
said operating mechanism structured to move between an open, first configuration and a closed, second configuration;
said number of springs include opening springs and closing springs;
said number of link members includes a trip latch member;
said circuit breaker sidewalls defining a pair of aligned D-shaft passages;
wherein, when said operating mechanism is in said closed configuration, said opening springs apply a D-shaft force via said close latch member;
a failure prediction assembly including a sensor supported D-shaft, a sensor assembly;
said sensor assembly including a housing and a number of sensors;
said sensor assembly housing defining a D-shaft passage;
a control unit, said control unit in electronic communication with said sensor assembly;
said sensor assembly housing coupled to said circuit breaker sidewalls with said sensor assembly housing D-shaft passage aligned with said circuit breaker sidewall D-shaft passages; and
said sensor supported D-shaft rotatably coupled to said sensor assembly with said sensor supported D-shaft disposed through said sensor assembly housing D-shaft passage.

12. The circuit breaker of claim 11 wherein:
said sensor supported D-shaft includes a number of sidewall portions;
said sensor supported D-shaft number of sidewall portions including a sensor assembly sidewall portion; and
wherein said sensor supported D-shaft sidewall sensor assembly sidewall portion has a smaller cross-sectional area than the associated circuit breaker sidewall D-shaft passage.

13. The circuit breaker of claim 11 wherein:
said control unit includes a record assembly, a comparison assembly, an FTB assembly and an output assembly;
said control unit structured to receive a sensor signal from each sensor in said number of sensors and to provide actual component characteristic output data to said FTB assembly;
said control unit structured to send an alert signal to said output assembly;
said FTB assembly structured to perform a number of functions to said actual component characteristic output data to generate calculated component characteristics;
a comparison assembly structured to receive an electronic signal from said record assembly and said FTB assembly to compare said calculated component characteristics to selected nominal data and to provide an indication signal as to whether said calculated component characteristics is acceptable when compared to the selected nominal data; and
wherein, if any calculated component characteristics is unacceptable, said control unit sends an alert signal to said output assembly.

14. The circuit breaker of claim 13 wherein each said sensor in said sensor assembly number of sensors is operatively coupled to the same link member.

15. The circuit breaker of claim 13 wherein each said sensor in said sensor assembly number of sensors is operatively coupled to said sensor supported D-shaft.

16. The circuit breaker of claim 15 wherein said sensor assembly is structured to determine a single actual component characteristic of said sensor supported D-shaft.

17. The circuit breaker of claim 16 wherein:
said FTB assembly include an FTB module;
said FTB module structured to perform a number of functions to said actual component characteristic output data to generate calculated component characteristics; and
wherein said FTB module calculates linkage characteristics for link members other than said sensor supported D-shaft.

18. The circuit breaker of claim 16 wherein said single actual component characteristic of said sensor supported D-shaft determined by said sensor assembly is a reactive trip latch force.

19. The circuit breaker of claim 16 wherein said FTB module includes the Eaton Equations.

20. The circuit breaker of claim 16 wherein said sensor assembly is mounted in one of a vertical orientation or a non-vertical orientation.

* * * * *